United States Patent
Igarashi

(10) Patent No.: US 6,593,214 B1
(45) Date of Patent: Jul. 15, 2003

(54) METHOD OF MANUFACTURING SEMICONDUCTOR DEVICE

(75) Inventor: Motoshige Igarashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/206,209

(22) Filed: Jul. 29, 2002

(30) Foreign Application Priority Data

Dec. 20, 2001 (JP) ........................................ 2001-387350

(51) Int. Cl.$^7$ ................................................ H01L 21/20
(52) U.S. Cl. ................... 438/480; 438/460; 438/462; 438/466; 438/598; 438/618; 438/619; 438/620
(58) Field of Search ................................ 438/197, 480, 438/598, 622, 460, 462, 466; 257/618, 619; 277/620

(56) References Cited

U.S. PATENT DOCUMENTS 5,982,023 A * 11/1999 Matsushit et al. .......... 257/626
6,261,883 B1 * 7/2001 Koubuchi et al. .......... 438/187
6,335,560 B1 * 1/2002 Takeuchi ..................... 257/620

FOREIGN PATENT DOCUMENTS

| JP | 4-91422 | 3/1992 |
| JP | 11-204506 | 7/1997 |

* cited by examiner

*Primary Examiner*—Hoai Ho
*Assistant Examiner*—Reneé R. Berry
(74) *Attorney, Agent, or Firm*—Oblon, Spivak, McClelland, Maier & Neustadt, P.C.

(57) ABSTRACT

A photoresist is provided with an opening as a dummy pattern in a space area, i.e., a dummy region, other than a pattern of elements and circuits in one chip, thereby increasing the number of openings in the photoresist and performing ion implantation. This reduces the number of ions entering into the photoresist. As a result, the area in which the photoresist hardens due to the entering ions can be reduced, resulting in improved removability of the photoresist. The occurrence of charge-up can also be reduced. With a reduction in the area of regions other than the openings in the photoresist, a location where strong surface tension is generated can hardly be present. This allows the dimensional accuracy of the photoresist to be improved without making the photoresist thin in film thickness.

5 Claims, 17 Drawing Sheets

F I G . 15
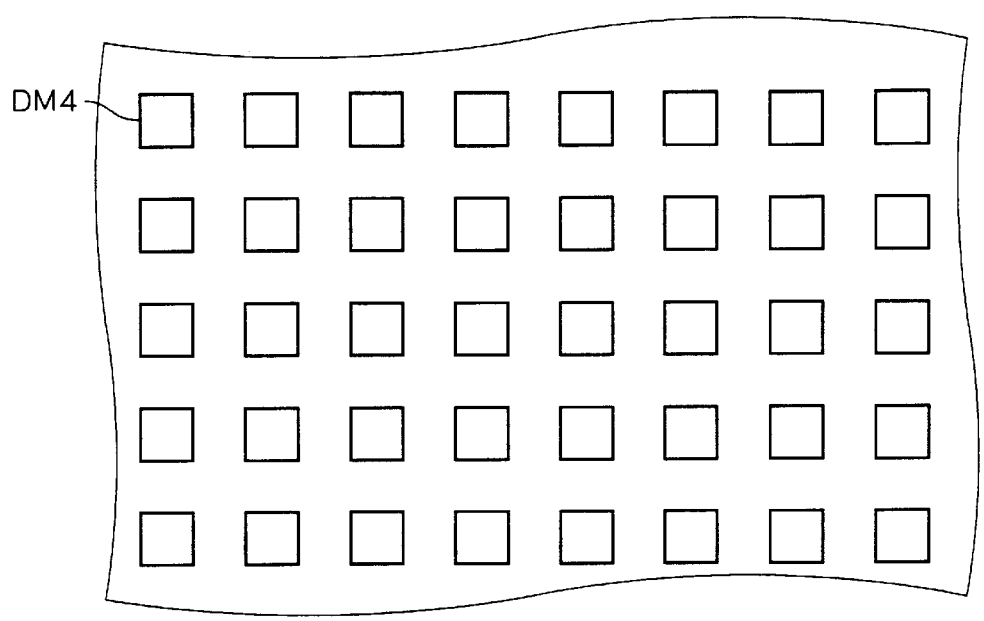
F I G . 16
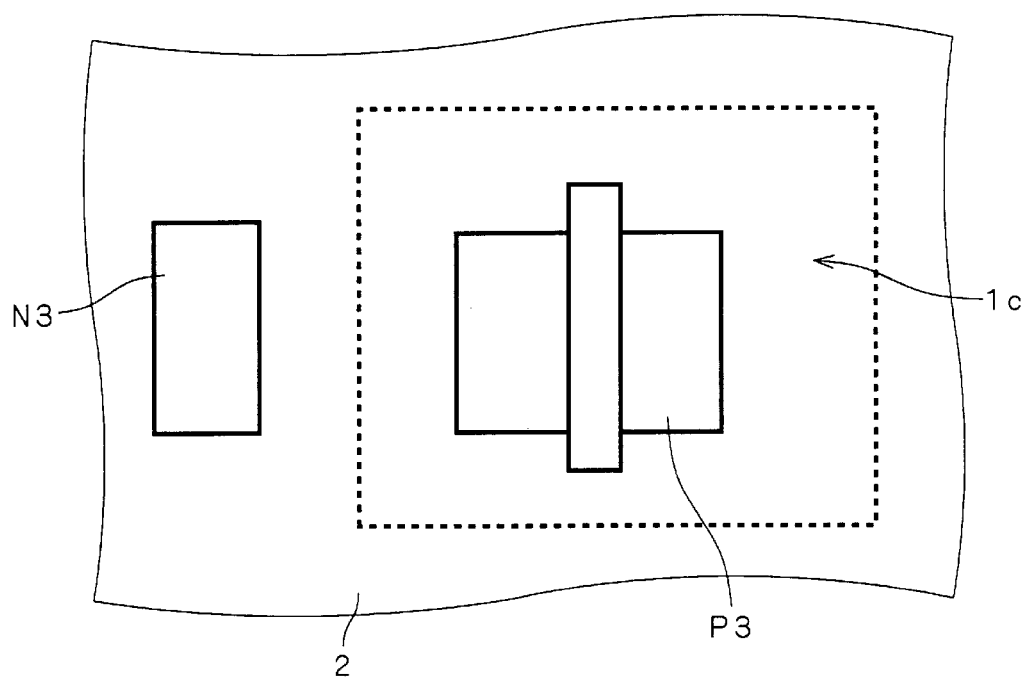

METHOD OF MANUFACTURING SEMICONDUCTOR DEVICE

BACKGROUND OF THE INVENTION

Field of the Invention

The present invention relates to a method of manufacturing a semiconductor device using the ion implantation technique.

Description of the Background Art

In manufacturing a semiconductor device, the ion implantation technique is generally employed, in which a photoresist is formed as a mask for selectively implanting ions into a substrate which is a target of implantation.

A photoresist functions as a mask in either case of selectively forming an insulating film and a conductive film on a substrate or selectively performing thermal diffusion of impurities on a surface of the substrate. Needless to say, a photoresist functions as a mask also when selectively performing ion implantation of impurities into a surface of the substrate.

When a photoresist is used as a mask for ion implantation, problems arise as will be described below.

The first problem is that the photoresist is difficult to be removed particularly when performing ion implantation of impurities of high concentration. Ion implantation causes ions to enter into the photoresist serving as a mask. The photoresist hardens accordingly, and may become difficult to be removed. As a result, resist residues may be generated, causing a reduction in yields of products.

To remove the photoresist without leaving residues, plasma ashing may be intensified or wet etching may be carried out rather excessively. However, intensification of ashing may inflict considerable charging damage upon the substrate, resulting in a reduction in the reliability of products. On the other hand, excessive wet etching and ultrasonic cleaning may cause a minute circuit pattern such as a gate electrode to fall or to be removed. Thus, it is not desirable to intensify ashing or carry out excessive wet etching.

In other words, there has been a problem of reducing the area in which a photoresist hardens in order to remove the photoresist easily, thereby improving its removability.

The second problem relates to the dimensional accuracy of the photoresist. The more minute the circuit pattern, the stricter the requirement for the dimensional accuracy of the photoresist needed for an implantation process.

For instance, when performing ion implantation into source/drain regions of a metal oxide semiconductor (MOS) transistor, a conventional photoresist has been provided with openings sufficiently larger than source/drain regions since a large element isolating layer is formed around the source/drain regions. However, as a pattern of elements and circuits becomes more minute, a different element may be provided immediately next to the MOS transistor, and it should be ensured that ions for forming the source/drain regions should not be implanted into the different element. Thus, the dimensional accuracy of the openings needs to be improved.

When the density of the openings in the photoresist vary with the location, however, the shape of the openings are easily changed. This will be described below referring to FIGS. 22 and 23.

FIG. 22 illustrates a wafer WF with product chips such as CP1 to CP4 formed on its surface. FIG. 23 is a magnified view of a boundary region R among the product chips CP1 to CP4. FIG. 23 illustrates a space area AR1 with no element or circuit formed therein provided in the product chip CP1 at the right of the region in which N-channel MOS transistors N1 and N2 and P-channel MOS transistors P1 and P2 are formed. The product chips CP2 to CP4 are similarly provided with space areas AR2 to AR4 having no element or circuit formed therein, respectively.

Openings of the photoresist cannot not be provided in such space area AR1 having no element or circuit formed therein. In other words, the density of the openings in the photoresist is high in the region in which the N-channel MOS transistor N1 and the like are formed, whereas the density is low in the space area AR1.

Generally, a photoresist tends to have a higher surface tension as it occupies a larger area. Thus, when the space area AR1 having no element or circuit formed therein is large, the photoresist in the region in which the N-channel MOS transistor N1 and the like are formed is pulled by the photoresist present on the side of the space area AR1. As a result, the openings provided for forming elements are deformed in shape toward the space area AR1, which tends to cause degradation in the dimensional accuracy of the openings.

An effective method of improving the dimensional accuracy of the photoresist is to make it thin in film thickness. The photoresist, when having a great film thickness, is strongly pulled by the surface toward the space area AR1 to increase the amount of deformation of the shape of the openings, whereas making the film thickness thin can achieve a reduction in the amount of deformation.

On the contrary, with such thin film, the photoresist might not function sufficiently as a mask in ion implantation. This is because ions penetrate through the thin photoresist to be implanted to the outside of a desired region.

In short, there has been a problem of improving the dimensional accuracy of a photoresist without making it thin in film thickness.

Referring now to the third problem, when a neutralizer that neutralizes charges of ions rushing into a substrate is degraded in performance, the ions are trapped in the photoresist to cause charge-up, resulting in electrostatic discharge damage in a gate insulating film and a capacitor dielectric film provided in the vicinity of the photoresist.

With electrostatic discharge damage caused in the gate insulating film and the capacitor dielectric film, a normal operation cannot be performed with a poor breakdown voltage, resulting in generation of a fail chip. Even if electrostatic discharge damage is not caused, damage might remain partly in the gate insulating film and the capacitor dielectric film. Such damage, although caused partly, generates a leakage current even if an operation is performed, which also results in generation of a fail chip.

In other words, there has been a problem of preventing the occurrence of charge-up of a photoresist.

SUMMARY OF THE INVENTION

An object of the present invention is to provide a method of manufacturing a semiconductor device capable of improving the resist removability by reducing the area in which a photoresist hardens in ion implantation and the dimensional accuracy of the photoresist as well as preventing the occurrence of charge-up of the photoresist.

An aspect of the invention is directed to a method of manufacturing a semiconductor device. The method includes the following steps of (a) to (c). The step (a) is forming a photoresist on a semiconductor substrate. The step (b) is performing patterning of the photoresist. The step (c) is performing ion implantation into the semiconductor substrate using the photoresist as a mask. In the patterning performed in the step (b), an opening is provided as a dummy pattern as well as an opening as a pattern of elements and circuits in a space area other than the pattern of elements and circuits in one chip.

With the method of the aspect, the photoresist for ion implantation is provided with the opening as the dummy pattern. Thus, the area of region other than the opening in the photoresist is reduced, which can reduce the number of ions entering into the photoresist. As a result, the resist removability can be improved by reducing the area in which a photoresist hardens. Further, the possibility of charge-up can be reduced by reducing the number of ions entering into the photoresist. Furthermore, with a reduction in the area of region other than the opening in the photoresist, there can hardly be present a location where strong surface tension is generated. Consequently, this allows the dimensional accuracy of the photoresist to be improved without making the photoresist thin in film thickness.

Preferably, in the method, a conductive material in contact with an end of the dummy pattern is formed on a surface of the semiconductor substrate exposed to the opening as the dummy pattern.

With the method, the conductive material in contact with the end of the dummy pattern is formed on the surface of the semiconductor substrate exposed to the opening as the dummy pattern. Thus, ions entered into the photoresist in ion implantation become easy to escape into the semiconductor substrate through the conductive material. Consequently, a further improvement in removability of the photoresist and a further reduction in the possibility of charge-up can be achieved.

Preferably, in the method, an active region in contact with an end of the dummy pattern is formed in a surface of the semiconductor substrate exposed to the opening as the dummy pattern.

With the method, the active region in contact with the end of the dummy pattern is formed on the surface of the semiconductor substrate exposed to the opening as the dummy pattern. Thus, ions entered into the photoresist in ion implantation become easy to escape into the semiconductor substrate through the active region. Consequently, a further improvement in removability of the photoresist and a further reduction in the possibility of charge-up can be achieved.

Preferably, in the method, a dicing line is formed in a surface of the semiconductor substrate, and the opening as the dummy pattern is provided on or close to the dicing line.

With the method, the opening as the dummy pattern is provided on or close to the dicing line. The photoresist can thus be separated chip by chip, which can prevent the difficulty in removing the photoresist and the possibility of charge-up per chip. As a result, this can prevent the effect of degradation, if any, caused in a chip from being exerted on another chip. When the opening as the dummy pattern is provided on the dicing line, ions entered into the photoresist in ion implantation become easy to escape into the semiconductor substrate through the dicing line, resulting in a further improvement in removability of the photoresist and a further reduction in the possibility of charge-up.

Preferably, in the method, the ratio of the area of the opening as the dummy pattern to the whole area of one chip is adjusted in accordance with the area of the opening as the pattern of elements and circuits.

With the method, the ratio of the area of the opening as the dummy pattern to the whole area of one chip is adjusted in accordance with the area of the opening as the pattern of elements and circuits. Such adjustment of the area of the opening in the photoresist permits optimization of the effects of improving the removability of the photoresist, improving the dimensional accuracy and preventing the occurrence of charge-up.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 15 through 19 illustrate the method of forming the photomasks according to the third preferred embodiment;

DESCRIPTION OF THE PREFERRED EMBODIMENTS

<First Preferred Embodiment>

The present embodiment is directed to a method of manufacturing a semiconductor device by performing ion implantation into a space area other than a pattern of elements and circuits in one chip through a photoresist having an opening as a dummy pattern.

Figure 1:
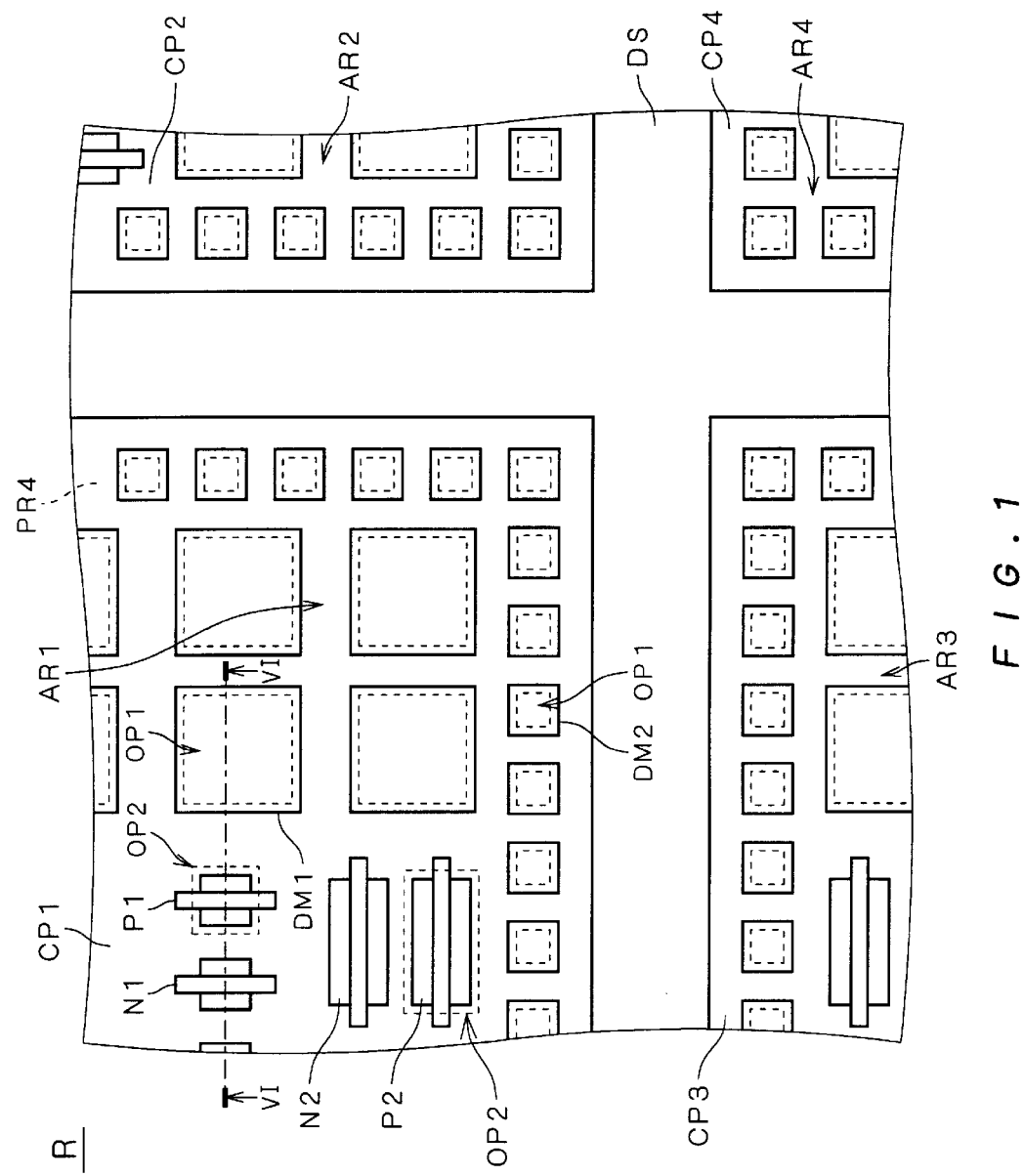
FIG. 1 is a top view illustrating a method of manufacturing a semiconductor device according to a first preferred embodiment of the present invention.

FIGS. 1 through 6 illustrate the steps of the method of the present embodiment. FIGS. 2 through 6 are sectional views taken on the section line VI—VI of FIG. 1 illustrating the steps of forming wells and MOS transistors in a semiconductor substrate 1. FIG. 1 is a top view illustrating the state of FIG. 6 after forming a photoresist PR4.

Figure 6:
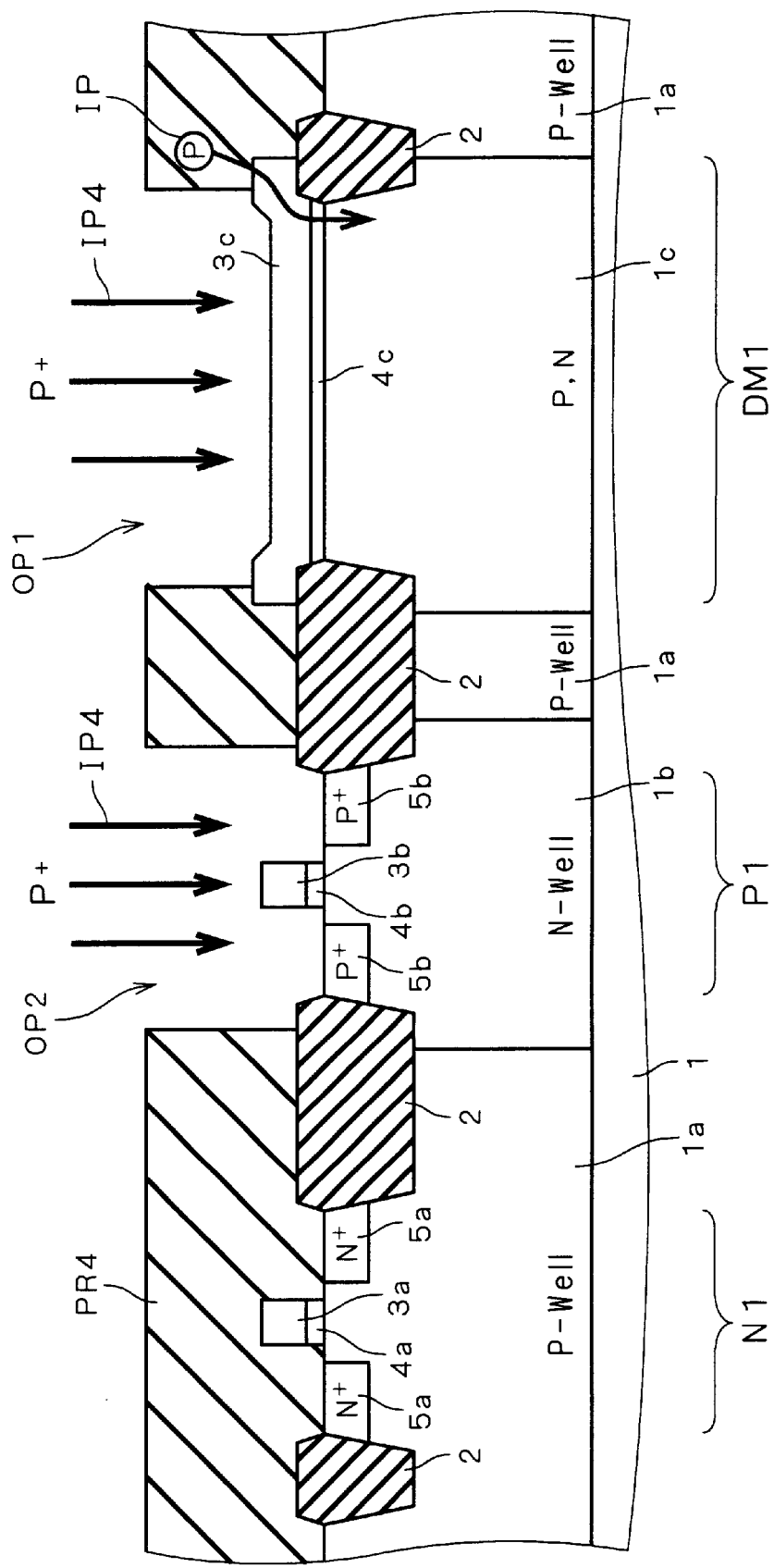
Figure 23:
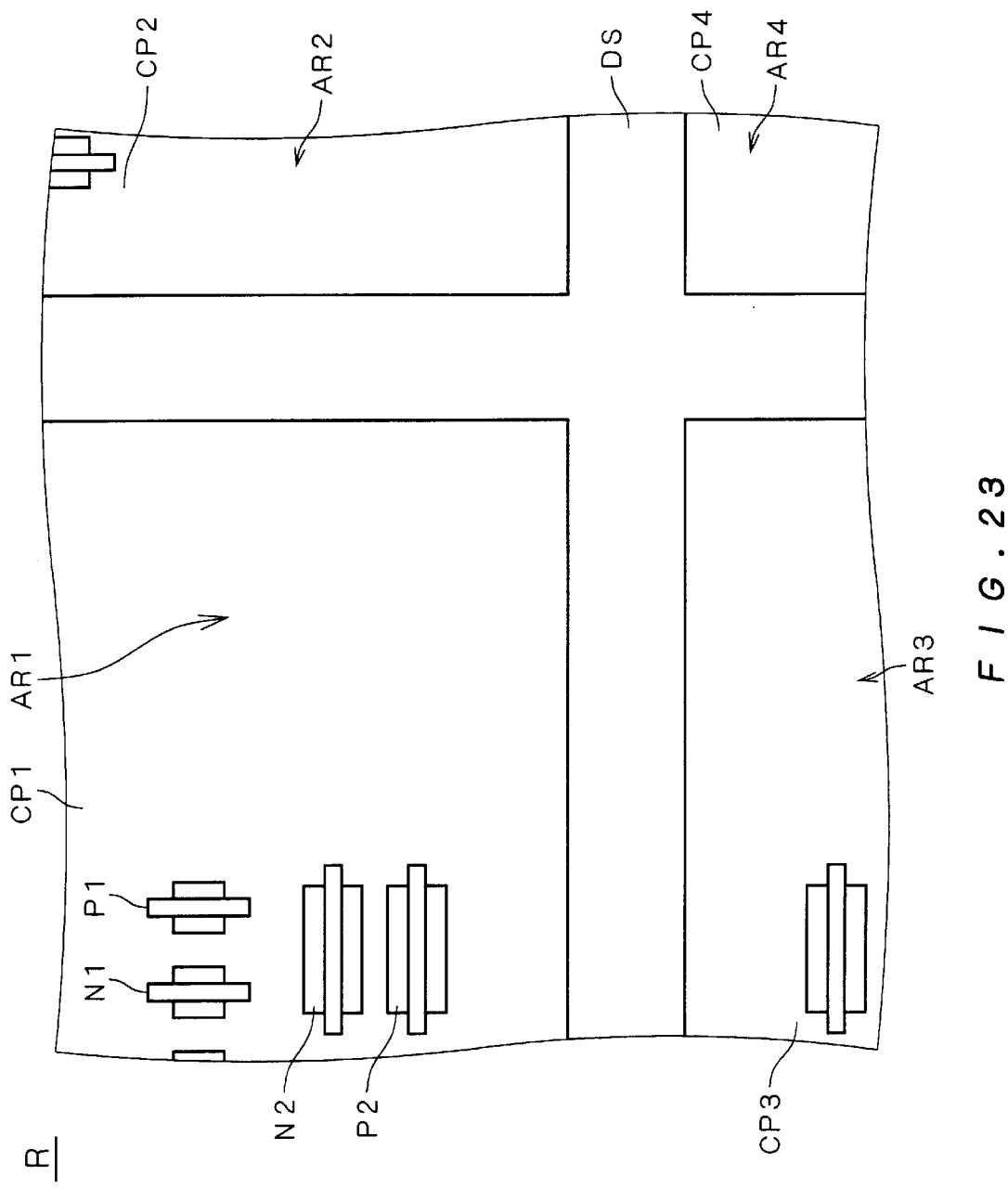
FIG. 23 is a magnified view illustrating a boundary region R among the product chips.

The structure illustrated in FIG. 1 corresponds to that of FIG. 23 cited as background art, in which elements having similar functions as those in FIG. 23 are designated by the same characters. As illustrated in FIGS. 1 and 6, dummy regions DM1 and DM2 are formed in the space area AR1 of the chip CP1 in addition to the structure of FIG. 23. The same applies to the other chips CP2 to CP4, in which dummy regions are formed in the space areas AR2 to AR4, respectively.

The photoresist PR4 for ion implantation is provided with not only an opening OP2 as the pattern of elements and circuits but also a dummy pattern for ion implantation as an opening OP1 in the dummy regions DM1 and DM2 (the openings OP1 and OP2 in the photoresist PR4 are indicated by broken lines in FIG. 1).

Referring to FIGS. 2 through 6, a process for forming the wells, the MOS transistors and the dummy regions in the semiconductor substrate 1 will be described.

Figure 2:
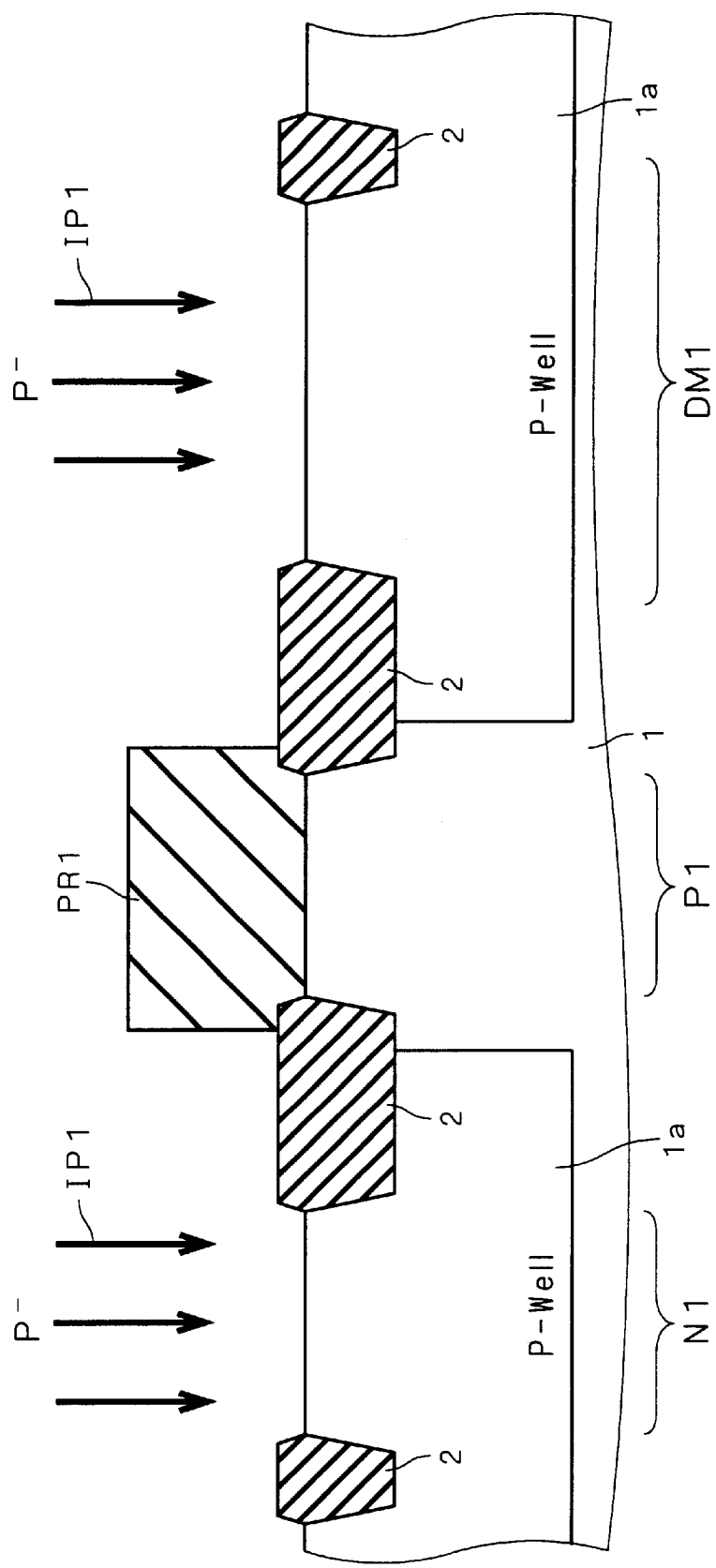
FIGS. 2 through 6 are sectional views illustrating the method of manufacturing the semiconductor device according to the first preferred embodiment.

An element isolating region 2 is formed on a surface of the semiconductor substrate 1 by local oxidation of silicon (LOCOS) or the like. A photoresist PR1 is formed on the surface of the semiconductor substrate 1 and is thereafter patterned such that openings are provided in a region for the N-channel transistor N1 to be formed and the dummy region DM1. Ion implantation IP1 of a P-type impurity is performed using the patterned photoresist PR1 as a mask. A P-type well 1a is thereby formed in the region for the N-channel transistor N1 (FIG. 2).

Since the dummy region DMI is essentially a space area in which no element or circuit is formed, the P-type well 1a is not needed, however, the opening as the dummy pattern is provided in order to increase the number of openings in the photoresist PR1. The advantages of increasing the number of openings will be described later.

Figure 3:
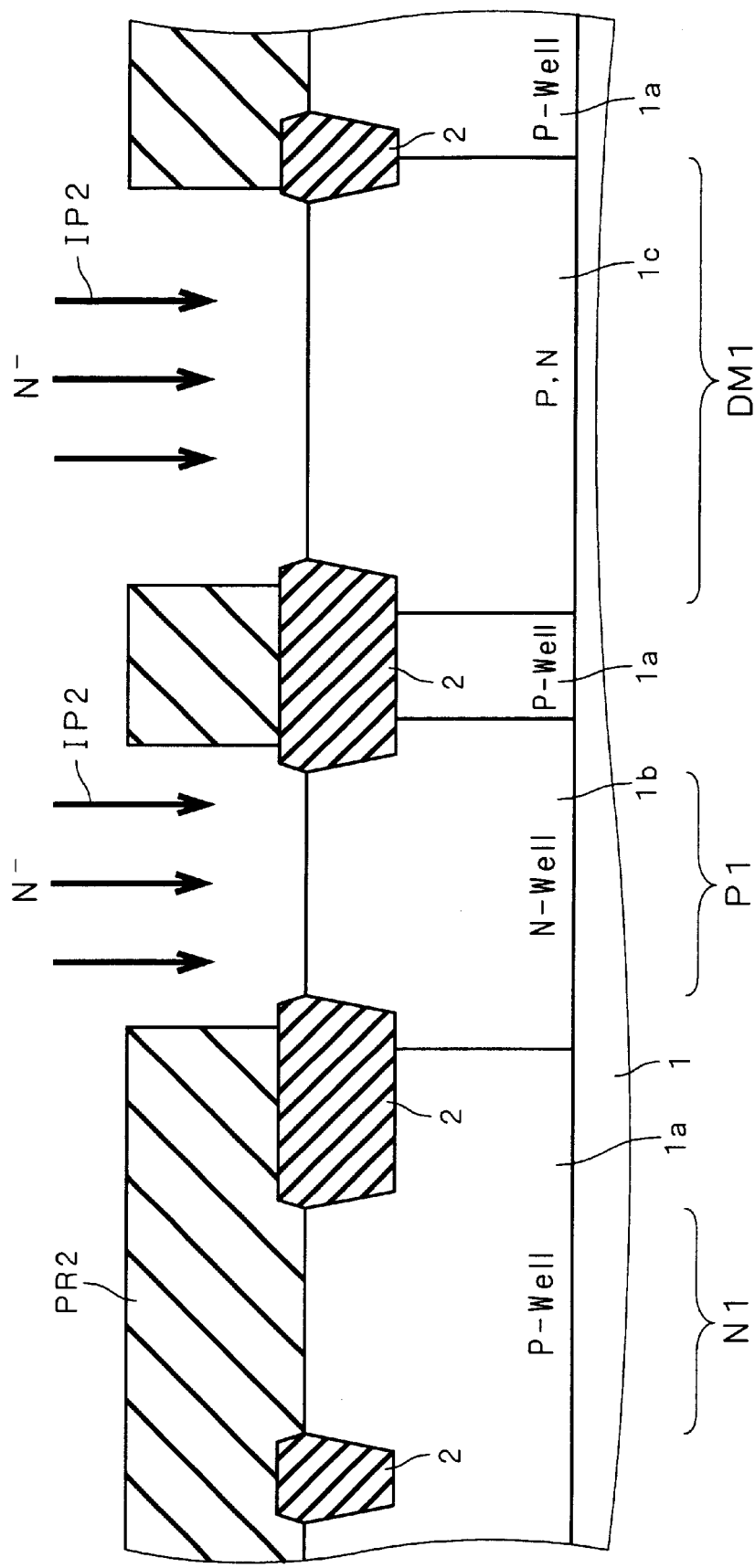

Next, the photoresist PR1 is removed. A photoresist PR2 is then formed on the surface of the semiconductor substrate 1 and is patterned such that openings are provided in a region for the P-channel transistor P1 to be formed and the dummy region DM1. Ion implantation IP2 of an N-type impurity is performed using the patterned photoresist PR2 as a mask. An N-type well 1b is thereby formed in the region for the P-channel transistor P1 (FIG. 3). The opening as the dummy pattern is provided in the dummy region DMI in order to increase the number of openings in the photoresist PR2. Accordingly, a well 1c formed in the dummy region DM1 is subjected to ion implantation of both of P- and N-type impurities.

Figure 4:
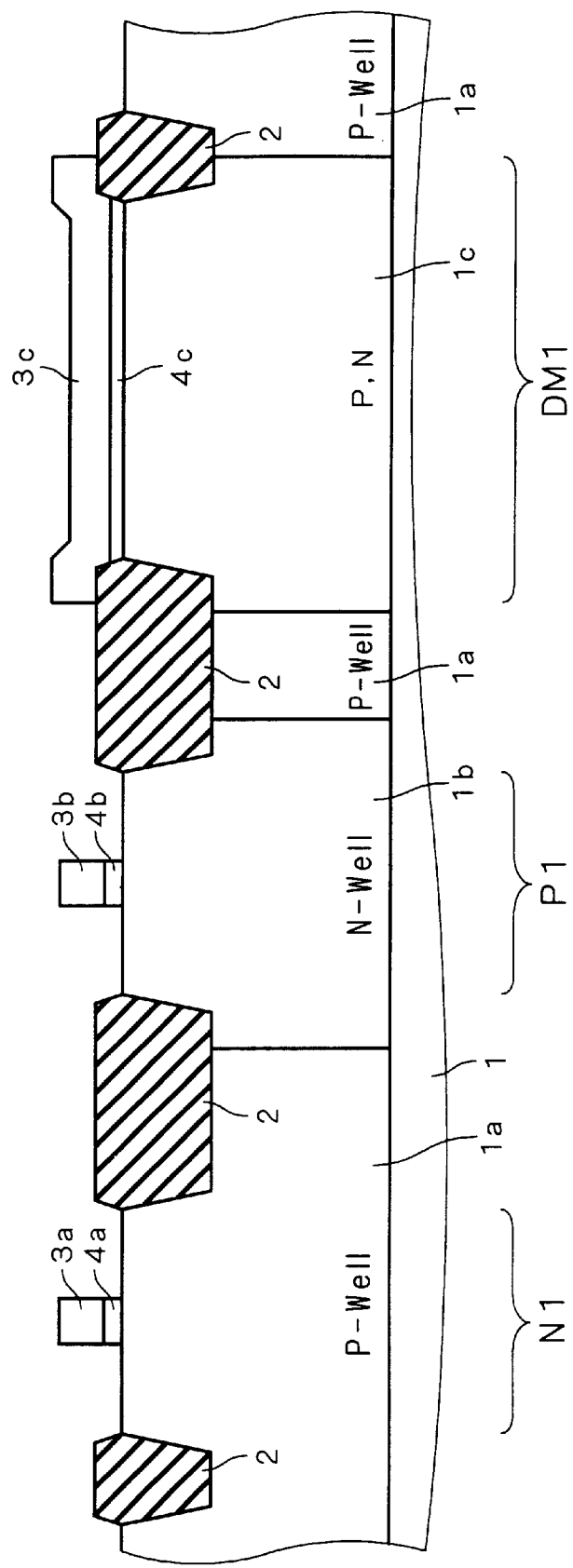

Next, the photoresist PR2 is removed, and an insulating material and a conductive material are laminated on the entire surface of the semiconductor substrate 1. The patterning of these materials is performed using photolithography and etching processes, thereby forming gate electrodes 3a and 3b as well as gate insulating films 4a and 4b in the region for the N-channel transistor and that for the P-channel transistor, respectively (FIG. 4). In the dummy region DM1, a dummy gate electrode 3c and a dummy gate insulating film 4c are formed on its entire surface.

Figure 5:
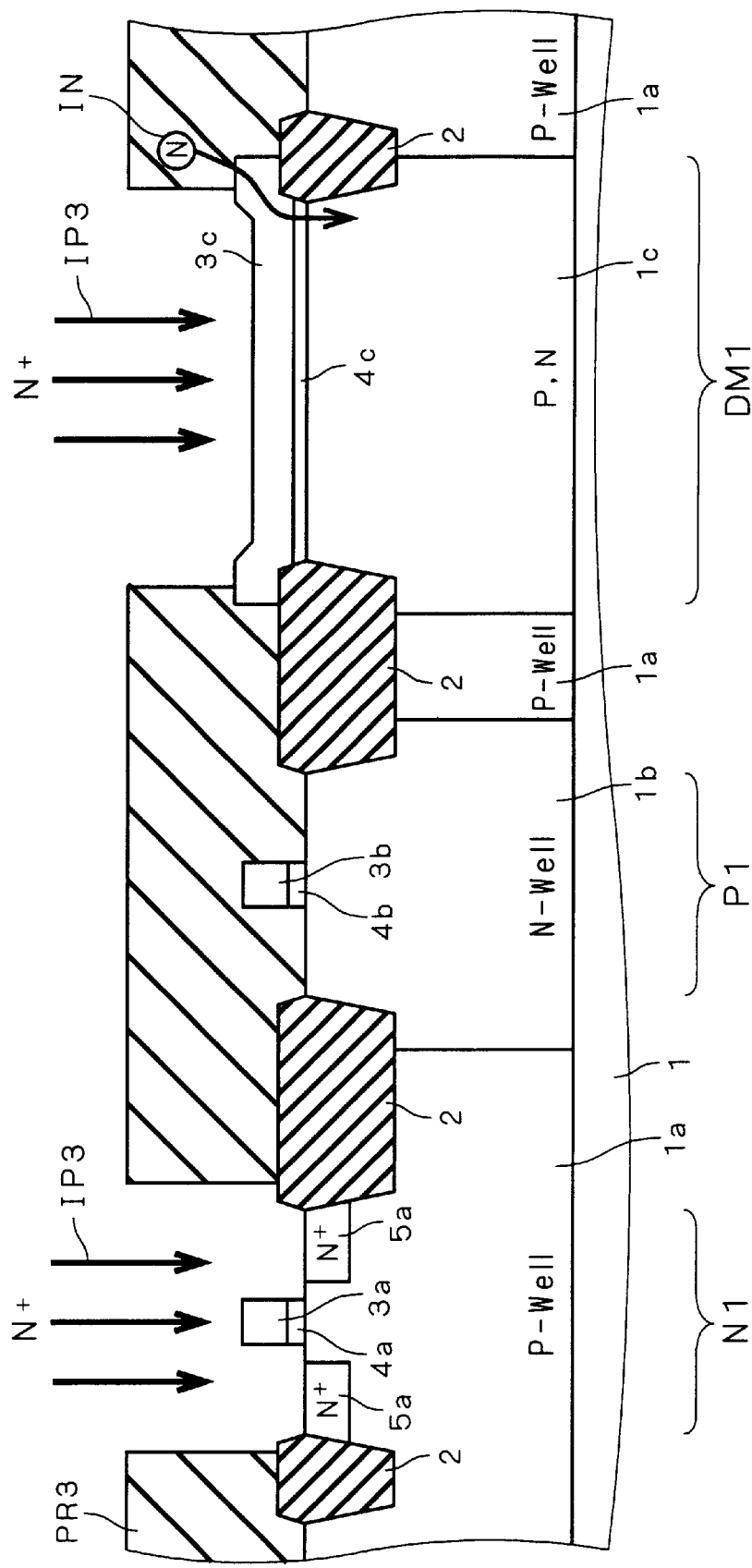

Next, a photoresist PR3 is formed on the surface of the semiconductor substrate 1 and is patterned such that openings are provided in the region for the N-channel transistor N1 and the dummy region DM1. Ion implantation IP3 of an N-type impurity is performed using the patterned photoresist PR3 as a mask. Source/drain regions 5a are thereby formed in the region for the N-channel transistor N1 (FIG. 5). The opening as the dummy pattern is provided in the dummy region DM1 in order to increase the number of openings in the photoresist PR3. Accordingly, the dummy gate electrode 3c formed in the dummy region DM1 is subjected to ion implantation of an N-type impurity.

Next, the photoresist PR3 is removed. The photoresist PR4 is then formed on the surface of the semiconductor substrate 1 and is patterned such that openings are provided in the region for the P-channel transistor P1 and the dummy region DM1. Ion implantation IP4 of a P-type impurity is performed using the patterned photoresist PR4 as a mask. Source/drain regions 5b are thereby formed in the region for the P-channel transistor P1 (FIG. 6). The opening as the dummy pattern is provided in the dummy region DM1 in order to increase the number of openings in the photoresist PR4. Accordingly, the dummy gate electrode 3c formed in the dummy region DM1 is also subjected to ion implantation of a P-type impurity.

Now, the advantages of increasing the number of openings by providing the dummy patterns in the photoresists PR1 to PR4 will be described.

The provision of the openings as the dummy patterns in the photoresists PR1 to PR4 for ion implantation permits a reduction in the area of regions other than the openings in the photoresists to thereby reduce the number of ions entering into the photoresists. This allows the areas in which the photoresists harden due to the entering ions to be reduced, resulting in an improvement in removability of the photoresists.

At this time, ions which do not enter into the photoresists are implanted into the semiconductor substrate 1, as a matter of course, however, implantation performed through the dummy regions does not affect the operation of the semiconductor device. This is because the dummy regions are formed in selected locations that do not affect the operation of the semiconductor device. For instance, separation of the P-channel transistor P1 and the dummy region DM1 by approximately $1\mu m$ prevents the dummy region DM1 from affecting the operation of the P-channel transistor P1. The dummy region DM1 may be set in a size of approximately 1 to several $\mu$, for example.

Further, the possibility of charge-up can be reduced by reducing the number of ions entering into the photoresists. This restricts the occurrence of electrostatic discharge damage and the like in gate insulating films and capacitor dielectric films provided in the vicinity of the photoresists.

Furthermore, with a reduction in the area of regions other than the openings in the photoresists, there can hardly be present a location where strong surface tension is generated. Consequently, this allows the dimensional accuracy of the photoresists to be improved without making them thin in film thickness.

Therefore, with the method of the present embodiment, a semiconductor device of high reliability can be manufactured.

As illustrated in FIGS. 5 and 6, where a conductive material such as the dummy gate electrode 3c in contact with an end of the dummy pattern is formed on the surface of the semiconductor substrate 1 exposed to the opening as the dummy pattern, the ion IN or IP entered into the photoresists in ion implantation easily escapes into the semiconductor substrate 1 through the conductive material. As a result, a further improvement in removability of the photoresists and a further reduction in the possibility of charge-up can be achieved.

Figure 7:
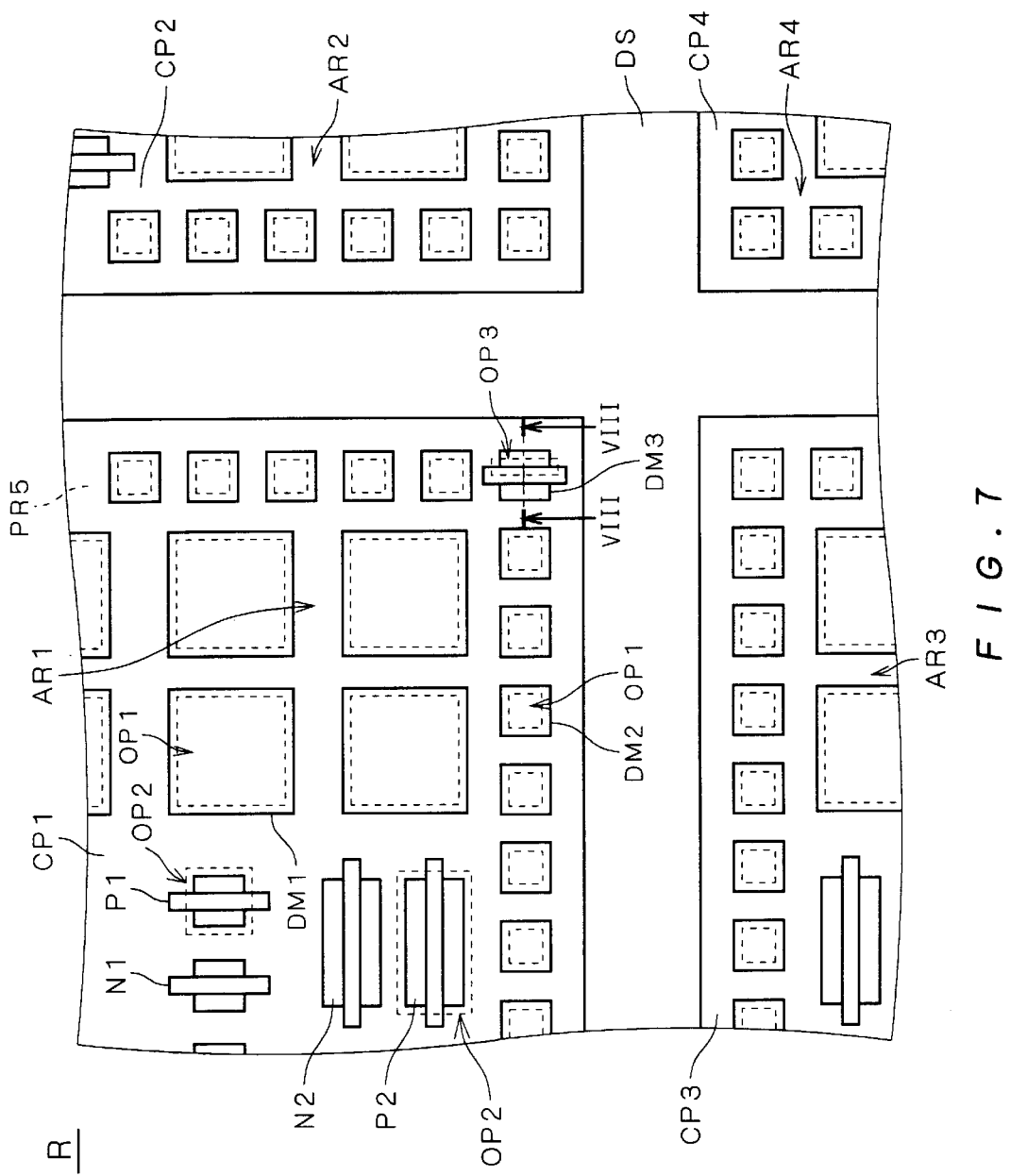
FIG. 7 is a top view illustrating the method of manufacturing the semiconductor device according to the first preferred embodiment.
Figure 8:
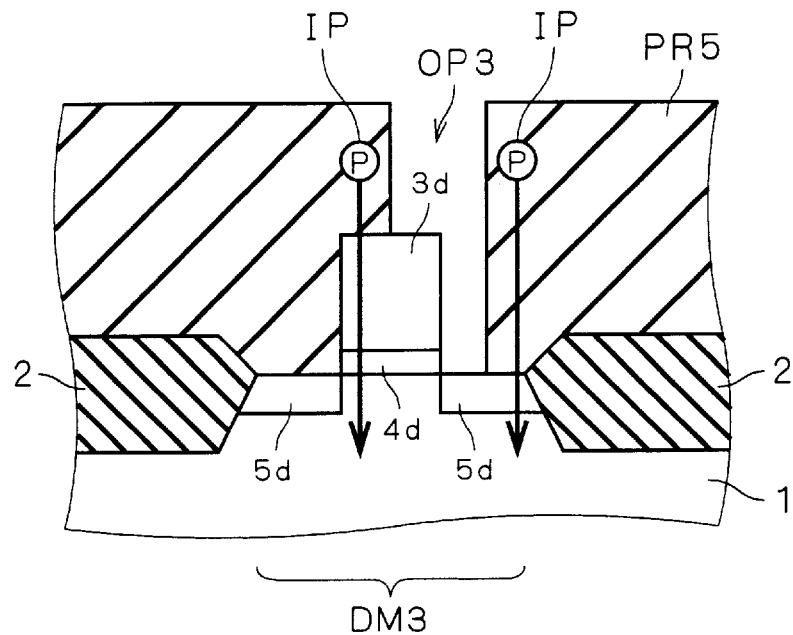
FIG. 8 is a sectional view illustrating the method of manufacturing the semiconductor device according to the first preferred embodiment.

As illustrated in FIGS. 7 and 8 (FIG. 8 is a sectional view taken on the section line VIII—VIII of FIG. 7), in the case that a dummy region DM3 having a MOS transistor structure is provided, for example, the ion IP entered into the photoresists in ion implantation easily escapes into the semiconductor substrate 1 through a dummy gate electrode 3d where an end of an opening OP3 serving as a dummy pattern in a photoresist PR5 is in contact with the dummy gate electrode 3d. Even when the end of the opening OP3 is in contact with a dummy active region 5d, the ion IP entered into the photoresists in ion implantation also easily escapes into the semiconductor substrate 1 through the dummy active region 5d. Therefore, a further improvement in removability of the photoresists and a further reduction in the possibility of charge-up can also be achieved in these cases.

The dummy gate insulating film 4c and a dummy gate insulating film 4d may be made thin in film thickness similarly to the gate insulating films 4a and 4b included in the N- and P-channel MOS transistors N1 and P1 functioning as semiconductor devices, respectively. This is because thin gate insulating films allow ions entered into the photoresists to easily escape into the semiconductor substrate 1.

The ratio of the total area of the openings as the dummy patterns in the photoresists to the whole area of one chip is adjusted in accordance with the area of the openings as the pattern of elements and circuits to be formed. When the area of the openings as the pattern of elements and circuits is small, for instance, the total area of the openings as the dummy patterns is set large, and is set small in the opposite case.

The ratio of the total area of the openings as the dummy patterns to the whole area of one chip is set within a range of 30–70%, for example. Such adjustment of the area of the openings in the photoresists permits optimization of the effects of improving the removability of the photoresists, improving the dimensional accuracy and preventing the occurrence of charge-up.

The method of manufacturing the semiconductor device according to the present embodiment can be applied to various ion implantation processes such as implantation in forming a well, implantation into a channel region for controlling a threshold value, implantation into a gate electrode and source/drain active regions of a MOS transistor (including implantation for forming a MOS capacitor), implantation for forming a lightly doped drain (LDD) region, implantation performed to a bottom of a contact hole after forming the hole.

Figure 9:
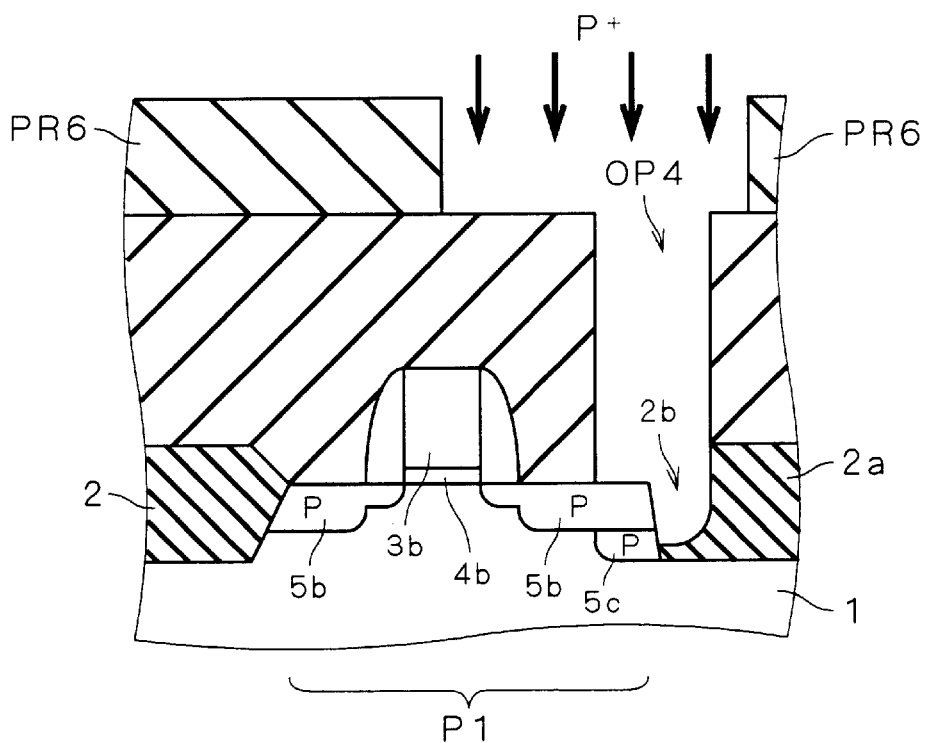
FIG. 9 is a sectional view illustrating implantation performed into a bottom of a contact hole after forming the hole.

The last example mentioned above, "implantation performed to a bottom of a contact hole after forming the hole" is a remedy for the case that, although an opening OP4 is provided as a contact hole as illustrated in FIG. 9, misalignment causes excessive etching of an element isolating region 2a, resulting in generation of a recess 2b in the contact hole. That is, an exposed part of the semiconductor substrate 1 is subjected to ion implantation such that the semiconductor substrate 1 as exposed to the recess 2b and the source/drain regions 5b are not brought into a conductive state with a contact plug, thereby forming enlarged source/drain regions 5c.

In the above case, ion implantation may also be performed by providing a dummy pattern in a photoresist in a dummy region.

<Second Preferred Embodiment>

The present embodiment is a variant of the method of manufacturing the semiconductor device according to the first preferred embodiment, in which openings as dummy patterns are provided on or close to a dicing line of a wafer.

Figure 10:
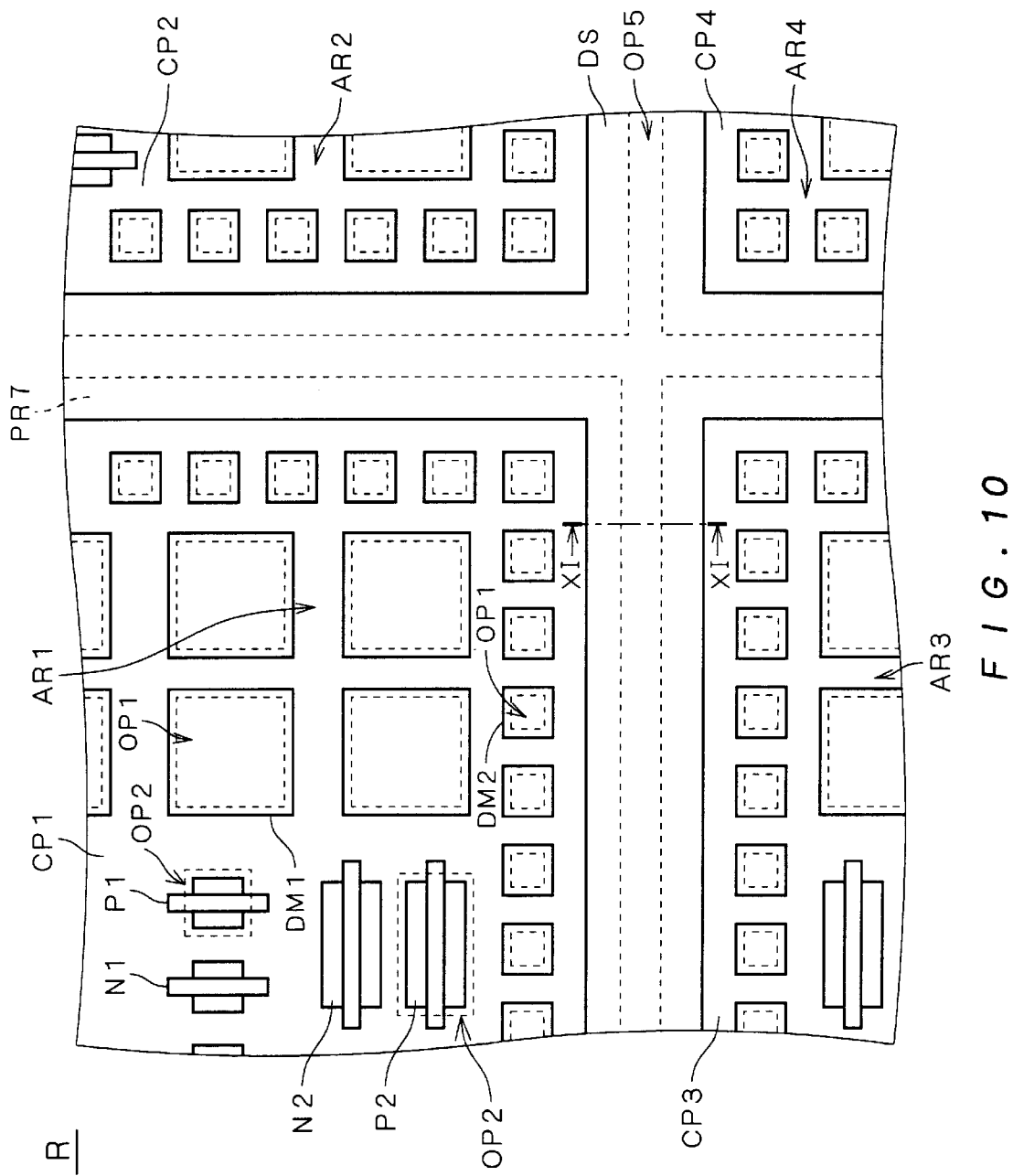
FIG. 10 is a top view illustrating a method of manufacturing a semiconductor device according to a second preferred embodiment of the invention.
Figure 11:
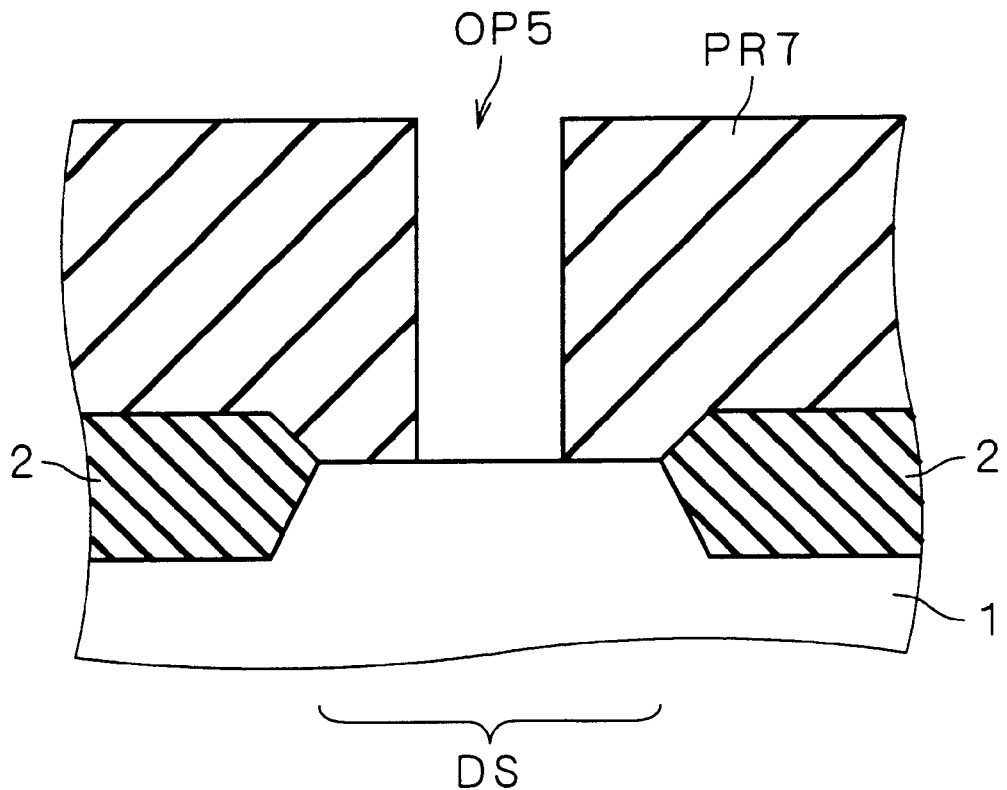
FIG. 11 is a sectional view illustrating the method of manufacturing the semiconductor device according to the second preferred embodiment.

As illustrated in FIGS. 10 and 11 (FIG. 11 is a sectional view taken on the section line XI—XI of FIG. 10), an opening OP5 as a dummy pattern in a photoresist PR7 is provided on the dicing line DS. Thus, the photoresist PR7 can be separated chip by chip.

With such arrangement, even if ions are excessively implanted into the photoresist PR7 in the chip CP1 to thereby cause hardening of the photoresist and the occurrence of charge-up, the effect will remain in the chip CP1. In short, the effect of degradation caused by ion implantation is not exerted on the other chips CP2 to CP4. Thus, the method of the present embodiment is capable of manufacturing a semiconductor device with improved yields.

Figure 12:
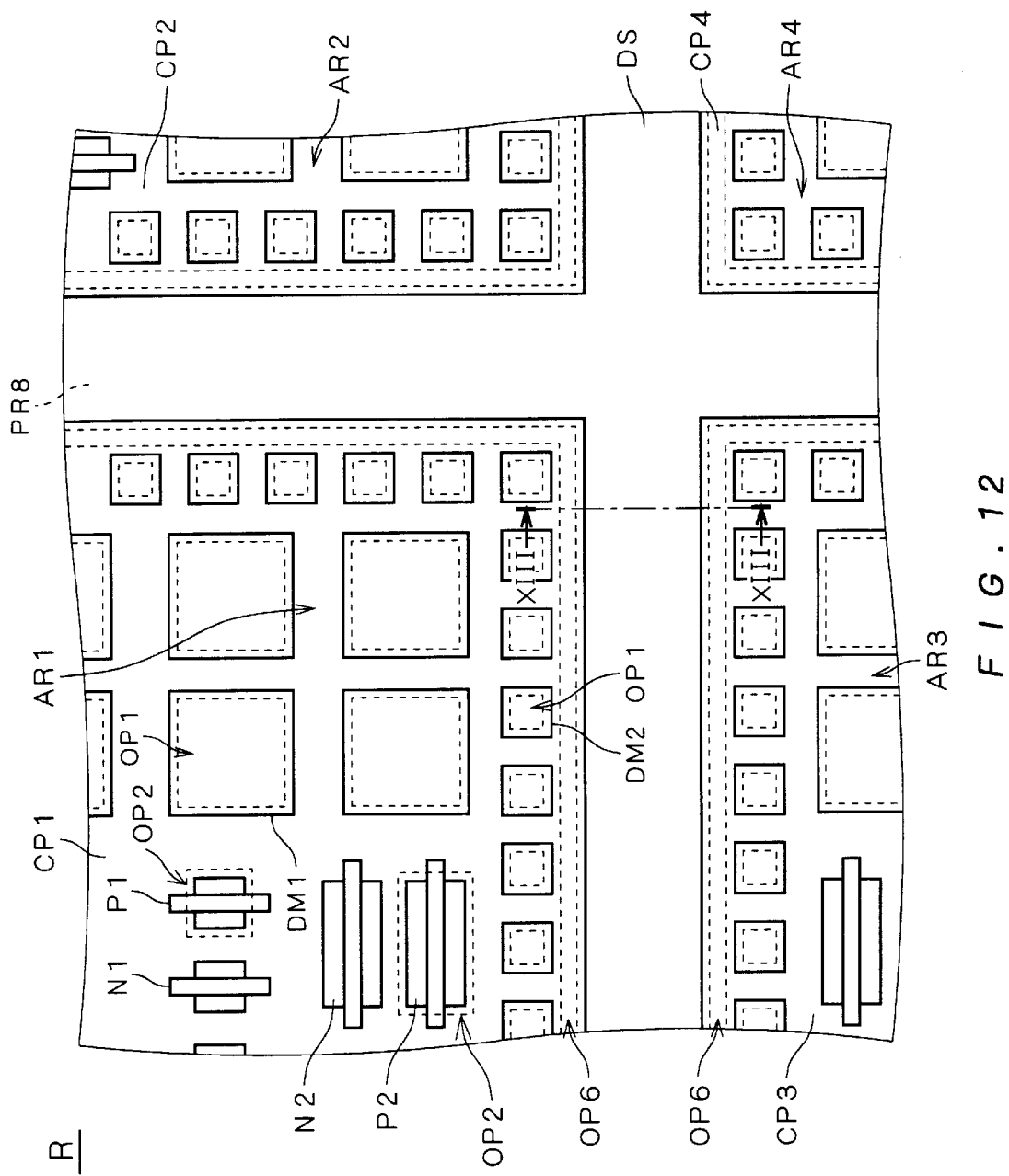
FIG. 12 is a top view illustrating the method of manufacturing the semiconductor device according to the second preferred embodiment.
Figure 13:
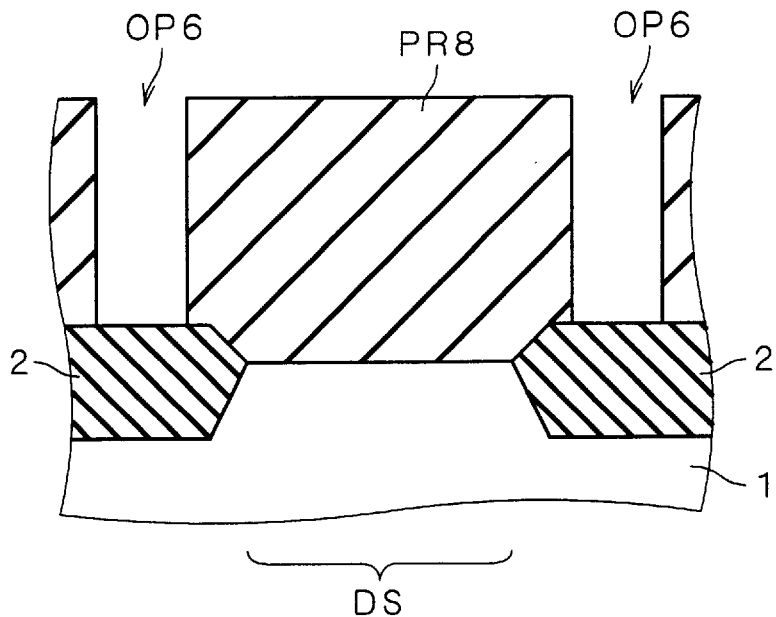
FIG. 13 is a sectional view illustrating the method of manufacturing the semiconductor device according to the second preferred embodiment.

As illustrated in FIGS. 12 and 13 (FIG. 13 is a sectional view taken on the section line XIII—XIII of FIG. 12), an opening OP6 as a dummy pattern in a photoresist PR8 may be provided on the element isolating region 2 close to the dicing line DS. This arrangement produces the effect similar to that in the case of FIGS. 10 and 11.

In FIGS. 10 and 11, however, the opening OP5 as the dummy pattern is provided on the dicing line DS. This produces an incidental effect that ions entered into the photoresist PR7 in ion implantation become easy to escape into the semiconductor substrate 1 through the dicing line DS, resulting in a further improvement in removability of the photoresists and a further reduction in the possibility of charge-up.

<Third Preferred Embodiment>The present embodiment is directed to a method of forming photomasks to be used in forming the photoresists used in the method of the first and second preferred embodiments. Forming the photomasks as will be described below allows the photoresists having the dummy patterns as described in the first and second preferred embodiments to be formed on the semiconductor substrate.

Figure 14:
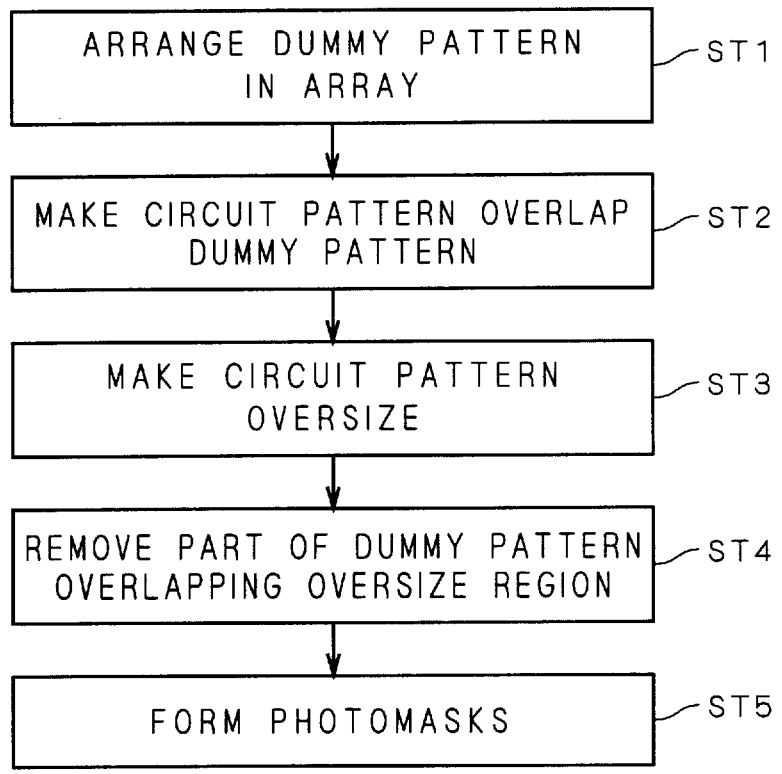
FIG. 14 is a flow chart illustrating a method of forming photomasks according to a third preferred embodiment of the invention.

FIG. 14 is a flow chart illustrating the method of forming the photomasks according to the present embodiment. First, a plurality of dummy regions DM4 are regularly arranged to form a dummy pattern as illustrated in FIG. 15 (step ST1). The drawing shows arrangement of the dummy regions in an array as an example of such regular arrangement.

Figure 17:
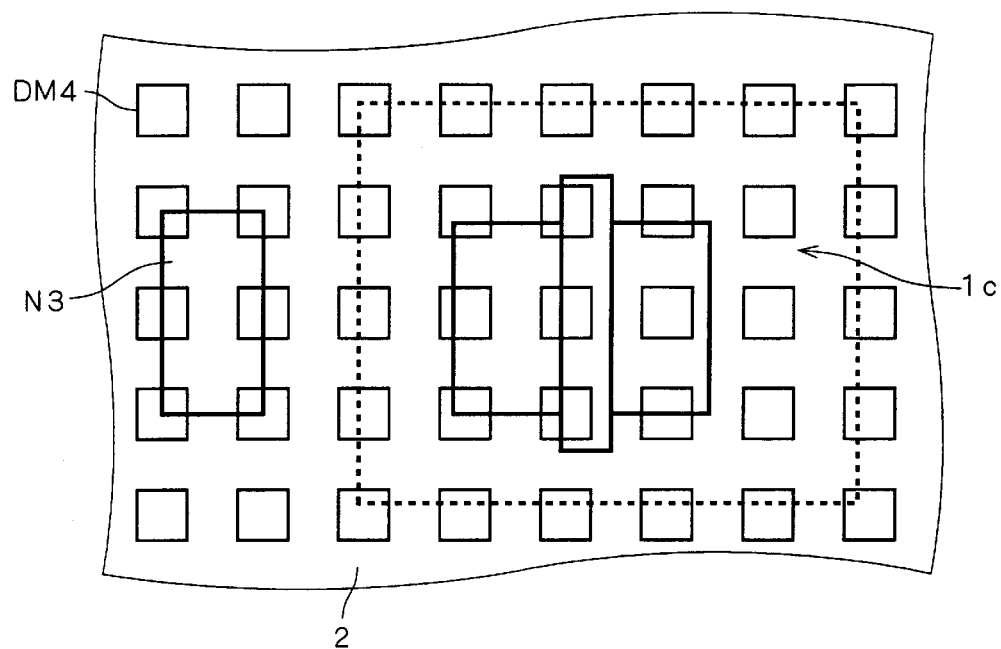

Next, a circuit pattern including a MOS transistor element P3, an active region N3 forming part of a circuit, the well 1c and the element isolating region 2 is prepared, and the dummy pattern of FIG. 15 is made overlap the circuit pattern (FIG. 17, step ST2).

Figure 18:
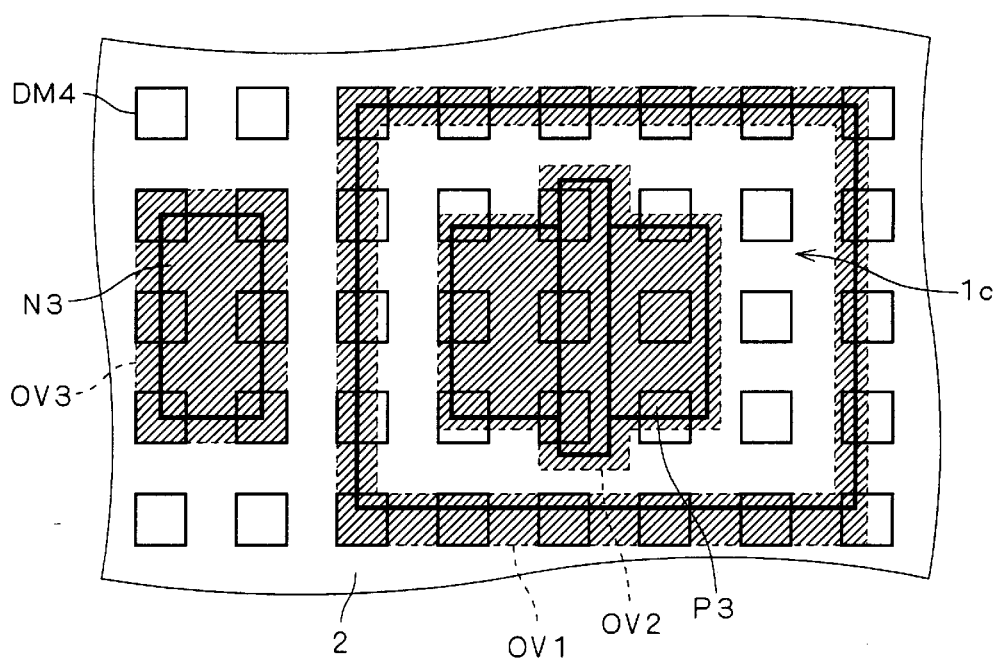

Next, the MOS transistor element P3 and the active region N3 in the circuit pattern are made oversize (i.e., magnified in area) to form oversize regions OV2 and OV3, and a border of the well 1c is made oversize to form an oversize region OV1 (FIG. 18, step ST3).

Figure 19:
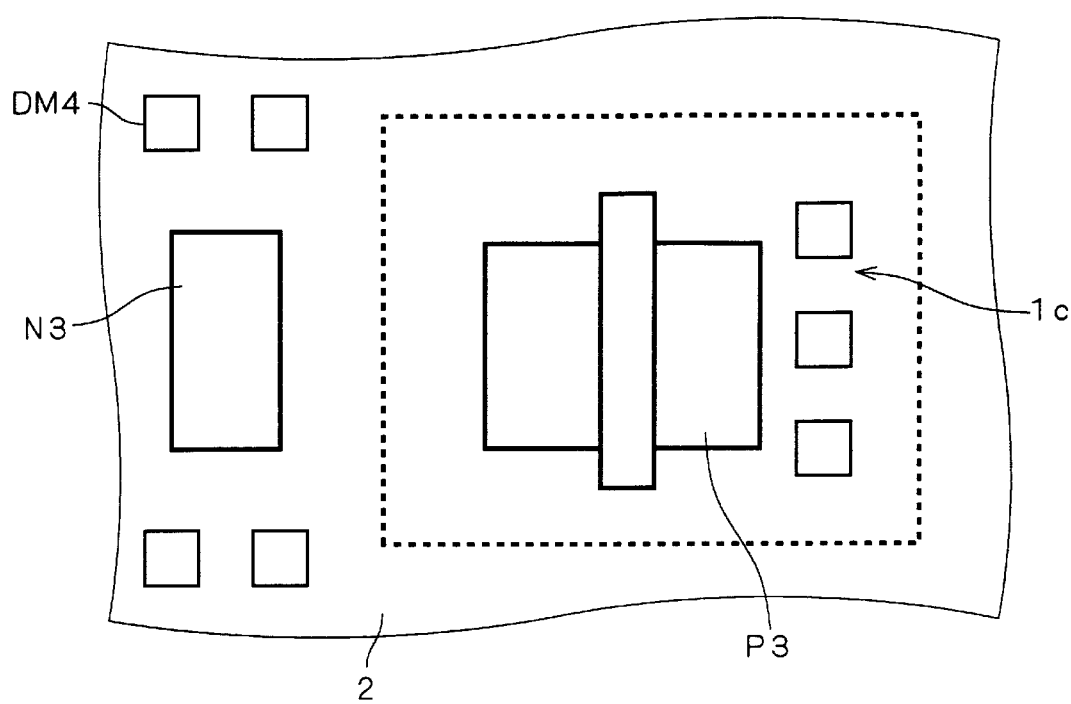

Subsequently, part of the dummy region DM4 overlapping the oversize region OV1, OV2 or OV3 is removed (FIG. 19, step ST4). Specifically, part of the dummy region DM4 extending off the periphery of the circuit pattern is also removed as well as the part of the dummy region DM4 overlapping the oversize region OV1, OV2 or OV3. The photomasks are formed based on the circuit pattern as obtained (step ST5).

Figure 20:
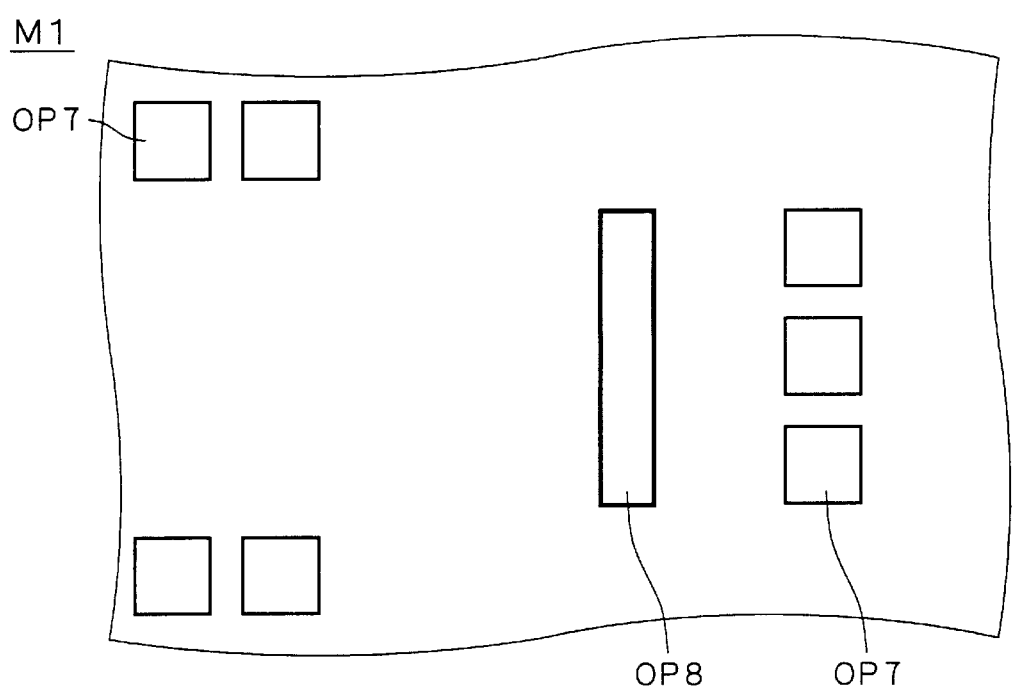
FIGS. 20 and 21 illustrate the photomasks obtained by the method according to the third preferred embodiment.

As illustrated in FIG. 20, a photomask M1 forming the gate electrode of the MOS transistor element P3 is formed by transferring the gate electrode and the dummy region DM4 from the circuit pattern illustrated in FIG. 19 to provide openings OP7 and OP8. The opening OP7 in the dummy region DM4 has an area slightly larger than that of the dummy region DM4 such that the dummy gate is formed to extend over the element isolating region 2.

Figure 21:
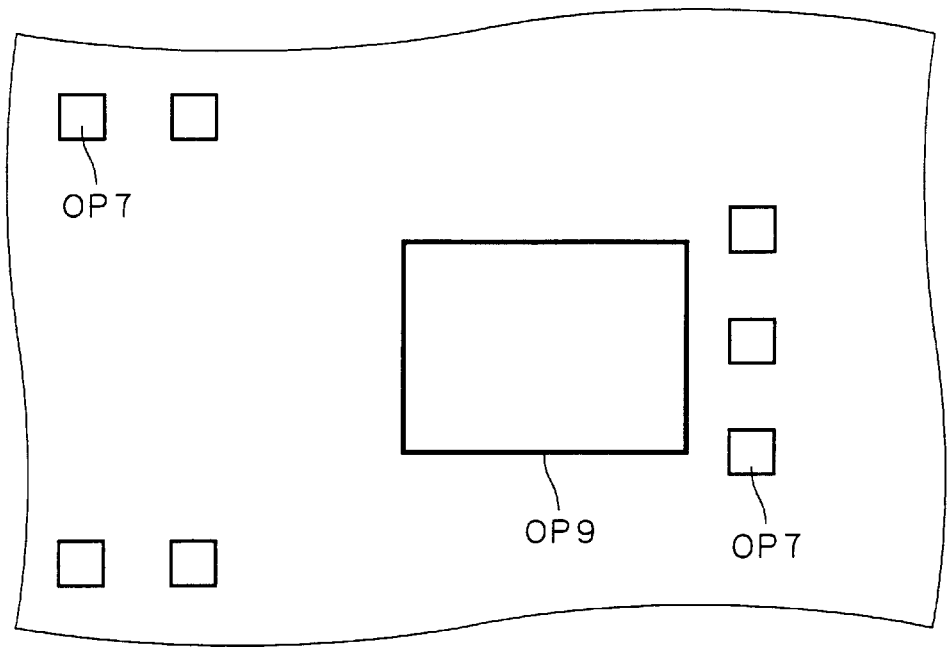
Figure 22:
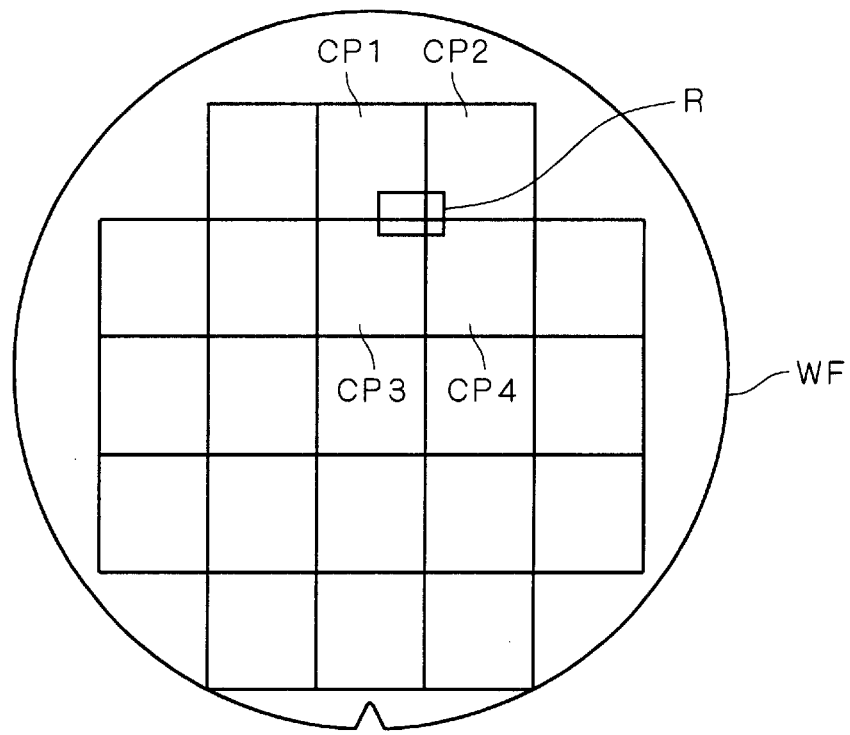
FIG. 22 illustrates a wafer having product chips formed on its surface.

Further, as illustrated in FIG. 21, a photomask M2 forming the source/drain active regions of the MOS transistor element P3 is formed by transferring the active region and the dummy region DM4 from the circuit pattern illustrated in FIG. 19 to provide the opening OP7 and an opening OP9. The reason why the opening OP7 illustrated in FIG. 21 is smaller than that in FIG. 20 is that the dummy active region shall be smaller than the dummy gate pattern.

As has been described, with the method of forming the photomasks according to the present embodiment, the part of the dummy region overlapping the pattern of elements and circuits or present on the border of the wells is removed, which avoids a risk that the elements and circuits or the wells are short-circuited by the dummy region. Further, the photomasks to which the dummy region defined in position and the pattern of elements and circuits or that of the wells are transferred is formed. The photoresists to be used in the method of the first and second embodiments can be formed using these photomasks.

Further, the removal of the part of the dummy region overlapping the oversize regions achieves further avoidance of the risk that the elements and circuits or the wells are short-circuited by the dummy region.

Dummy regions of different sizes such as the dummy regions DM1 and DM2 illustrated in FIG. 1 may be provided. In that case, an additional dummy region smaller than the dummy region DM4 may be provided, for example, in the position from which the dummy region DM4 is removed in the above-described step ST4 so as not to overlap the circuit pattern. This achieves finer adjustment of the area of the openings in the photoresists.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising the steps of:
   (a) forming a photoresist on a semiconductor substrate;
   (b) performing patterning of said photoresist; and
   (c) performing ion implantation into said semiconductor substrate using said photoresist as a mask, wherein
       in said patterning performed in said step (b), an opening is provided as a dummy pattern as well as an opening as a pattern of elements and circuits in a space area other than said pattern of elements and circuits in one chip.

2. The method according to claim 1, wherein
a conductive material in contact with an end of said dummy pattern is formed on a surface of said semiconductor substrate exposed to said opening as said dummy pattern.

3. The method according to claim 1, wherein
an active region in contact with an end of said dummy pattern is formed in a surface of said semiconductor substrate exposed to said opening as said dummy pattern.

4. The method according to claim 1, wherein
a dicing line is formed in a surface of said semiconductor substrate, and
said opening as said dummy pattern is provided on or close to said dicing line.

5. The method according to claim 1, wherein
the ratio of the area of said opening as said dummy pattern to the whole area of one chip is adjusted in accordance with the area of said opening as said pattern of elements and circuits.

* * * * *